United States Patent
Kweskin et al.

(10) Patent No.: US 7,994,019 B1
(45) Date of Patent: Aug. 9, 2011

(54) SILICON-OZONE CVD WITH REDUCED PATTERN LOADING USING INCUBATION PERIOD DEPOSITION

(75) Inventors: Sasha Kweskin, St. Louis, MO (US); Paul Edward Gee, San Jose, CA (US); Shankar Venkataraman, San Jose, CA (US); Kedar Sapre, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/891,149

(22) Filed: Sep. 27, 2010

Related U.S. Application Data

(60) Provisional application No. 61/319,970, filed on Apr. 1, 2010.

(51) Int. Cl.
*H01L 21/00* (2006.01)
(52) U.S. Cl. ......... 438/437; 438/786; 257/296; 257/774
(58) Field of Classification Search ................. 438/437, 438/786; 257/296, 774
See application file for complete search history.

(56) References Cited

U.S. PATENT DOCUMENTS

| | | | |
|---|---|---|---|
| 4,147,571 A | 4/1979 | Stringfellow et al. |
| 4,816,098 A | 3/1989 | Davis et al. |
| 4,818,326 A | 4/1989 | Liu et al. |
| 4,931,354 A | 6/1990 | Wakino et al. |
| 5,016,332 A | 5/1991 | Reichelderfer et al. |
| 5,110,407 A | 5/1992 | Ono et al. |
| 5,393,708 A | 2/1995 | Hsia et al. |
| 5,426,076 A | 6/1995 | Moghadam |
| 5,558,717 A | 9/1996 | Zhao et al. |
| 5,587,014 A | 12/1996 | Leychika et al. |
| 5,622,784 A | 4/1997 | Okaue et al. |
| 5,635,409 A | 6/1997 | Moslehi |
| 5,691,009 A | 11/1997 | Sandhu |

(Continued)

FOREIGN PATENT DOCUMENTS

DE 19654737 A1 7/1997

(Continued)

OTHER PUBLICATIONS

Coltrin, M.E., et al., "Chemistry of AlGaN Particulate Formation," National Nuclear Security Administration, Physical, Chemical, & Nano Sciences Center, Research Briefs, 2005, pp. 42-43.

(Continued)

*Primary Examiner* — Jarrett Stark
*Assistant Examiner* — Nicholas Tobergte
(74) *Attorney, Agent, or Firm* — Kilpatrick Townsend & Stockton LLP

(57) ABSTRACT

Aspects of the disclosure pertain to methods of depositing conformal silicon oxide layers on patterned substrates. In embodiments, dielectric layers are deposited by flowing a silicon-containing precursor and ozone into a processing chamber such that a relatively uniform dielectric growth rate is achieved across the patterned substrate surface having heterogeneous materials and/or a heterogeneous pattern density distribution. The deposition of dielectric layers grown according to embodiments may have a reduced dependence on underlying material and pattern density while still being suitable for non-sacrificial applications. Reduction in dependence on pattern density is achieved by terminating deposition near the end of an incubation period. Multiple deposition cycles may be conducted in series since the beneficial nature of the incubation period may repeat after a pause in deposition.

19 Claims, 5 Drawing Sheets

U.S. PATENT DOCUMENTS

| | | | |
|---|---|---|---|
| 5,786,263 A | 7/1998 | Perera | |
| 5,853,607 A | 12/1998 | Zhao et al. | |
| 5,937,308 A | 8/1999 | Gardner et al. | |
| 5,937,323 A | 8/1999 | Orczyk et al. | |
| 6,008,515 A | 12/1999 | Hsia et al. | |
| 6,009,830 A | 1/2000 | Li et al. | |
| 6,024,044 A | 2/2000 | Law et al. | |
| 6,087,243 A | 7/2000 | Wang | |
| 6,090,723 A | 7/2000 | Thakur et al. | |
| 6,140,242 A | 10/2000 | Oh et al. | |
| 6,146,970 A | 11/2000 | Witek et al. | |
| 6,156,581 A | 12/2000 | Vaudo et al. | |
| 6,165,834 A | 12/2000 | Agarwal et al. | |
| 6,180,490 B1 | 1/2001 | Vassiliev et al. | |
| 6,207,587 B1 | 3/2001 | Li et al. | |
| 6,287,962 B1 | 9/2001 | Lin | |
| 6,302,964 B1 | 10/2001 | Umotoy et al. | |
| 6,383,954 B1 | 5/2002 | Wang et al. | |
| 6,387,207 B1 | 5/2002 | Janakiraman et al. | |
| 6,406,677 B1 | 6/2002 | Carter et al. | |
| 6,448,187 B2 | 9/2002 | Yau et al. | |
| 6,503,557 B1 | 1/2003 | Joret | |
| 6,506,253 B2 | 1/2003 | Sakuma | |
| 6,508,879 B1 | 1/2003 | Hashimoto | |
| 6,509,283 B1 | 1/2003 | Thomas | |
| 6,524,931 B1 | 2/2003 | Perera | |
| 6,528,332 B2 | 3/2003 | Mahanpour et al. | |
| 6,544,900 B2 | 4/2003 | Raaijmakers et al. | |
| 6,548,416 B2 | 4/2003 | Han et al. | |
| 6,548,899 B2 | 4/2003 | Ross | |
| 6,559,026 B1 | 5/2003 | Rossman et al. | |
| 6,566,278 B1 | 5/2003 | Harvey et al. | |
| 6,589,868 B2 | 7/2003 | Rossman | |
| 6,596,654 B1 | 7/2003 | Bayman et al. | |
| 6,602,806 B1 * | 8/2003 | Xia et al. | 438/786 |
| 6,614,181 B1 | 9/2003 | Harvey et al. | |
| 6,624,064 B1 | 9/2003 | Sahin et al. | |
| 6,630,413 B2 | 10/2003 | Todd | |
| 6,645,303 B2 | 11/2003 | Frankel et al. | |
| 6,660,391 B1 | 12/2003 | Rose et al. | |
| 6,676,751 B2 | 1/2004 | Solomon et al. | |
| 6,683,364 B2 | 1/2004 | Oh et al. | |
| 6,716,770 B2 | 4/2004 | O'Neill et al. | |
| 6,756,085 B2 | 6/2004 | Waldfried et al. | |
| 6,787,191 B2 | 9/2004 | Hanahata et al. | |
| 6,794,290 B1 | 9/2004 | Papasouliotis et al. | |
| 6,818,517 B1 | 11/2004 | Maes | |
| 6,819,886 B2 | 11/2004 | Runkowske et al. | |
| 6,830,624 B2 | 12/2004 | Janakiraman et al. | |
| 6,833,052 B2 | 12/2004 | Li et al. | |
| 6,833,322 B2 | 12/2004 | Anderson et al. | |
| 6,835,278 B2 | 12/2004 | Selbrede et al. | |
| 6,858,523 B2 | 2/2005 | Deboer et al. | |
| 6,867,086 B1 | 3/2005 | Chen et al. | |
| 6,872,323 B1 | 3/2005 | Entley et al. | |
| 6,890,403 B2 | 5/2005 | Cheung | |
| 6,900,067 B2 | 5/2005 | Kobayashi et al. | |
| 6,955,836 B2 | 10/2005 | Kumagai et al. | |
| 6,958,112 B2 | 10/2005 | Karim et al. | |
| 7,018,902 B2 | 3/2006 | Visokay et al. | |
| 7,084,076 B2 | 8/2006 | Park et al. | |
| 7,109,114 B2 | 9/2006 | Chen et al. | |
| 7,115,419 B2 | 10/2006 | Suzuki | |
| 7,122,222 B2 | 10/2006 | Xiao et al. | |
| 7,129,185 B2 | 10/2006 | Aoyama et al. | |
| 7,148,155 B1 | 12/2006 | Tarafdar et al. | |
| 7,183,177 B2 | 2/2007 | Al-Bayati et al. | |
| 7,192,626 B2 | 3/2007 | Dussarrat et al. | |
| 7,205,248 B2 | 4/2007 | Li et al. | |
| 7,220,461 B2 | 5/2007 | Hasebe et al. | |
| 7,297,608 B1 | 11/2007 | Papasouliotis et al. | |
| 7,335,609 B2 * | 2/2008 | Ingle et al. | 438/787 |
| 7,399,388 B2 | 7/2008 | Moghadam et al. | |
| 7,419,903 B2 | 9/2008 | Haukka et al. | |
| 7,435,661 B2 | 10/2008 | Miller et al. | |
| 7,456,116 B2 * | 11/2008 | Ingle et al. | 438/787 |
| 7,498,273 B2 | 3/2009 | Mallick et al. | |
| 7,524,735 B1 | 4/2009 | Gauri et al. | |
| 7,524,750 B2 | 4/2009 | Nemani et al. | |
| 7,541,297 B2 | 6/2009 | Mallick et al. | |
| 7,745,352 B2 | 6/2010 | Mallick et al. | |
| 7,790,634 B2 | 9/2010 | Munro et al. | |
| 7,803,722 B2 | 9/2010 | Liang | |
| 7,825,038 B2 | 11/2010 | Ingle et al. | |
| 7,825,044 B2 | 11/2010 | Mallick et al. | |
| 7,867,923 B2 | 1/2011 | Mallick et al. | |
| 7,902,080 B2 | 3/2011 | Chen et al. | |
| 7,935,643 B2 | 5/2011 | Liang et al. | |
| 7,943,531 B2 | 5/2011 | Nemani et al. | |
| 2001/0021595 A1 | 9/2001 | Jang et al. | |
| 2001/0029114 A1 | 10/2001 | Vulpio et al. | |
| 2001/0038919 A1 | 11/2001 | Berry et al. | |
| 2001/0054387 A1 | 12/2001 | Frankel et al. | |
| 2002/0048969 A1 | 4/2002 | Suzuki et al. | |
| 2002/0081817 A1 | 6/2002 | Bhakta et al. | |
| 2002/0127350 A1 | 9/2002 | Ishikawa et al. | |
| 2002/0142585 A1 | 10/2002 | Mandal | |
| 2002/0146879 A1 | 10/2002 | Fu et al. | |
| 2002/0164891 A1 | 11/2002 | Gates et al. | |
| 2003/0040199 A1 | 2/2003 | Agarwal | |
| 2003/0064154 A1 | 4/2003 | Laxman et al. | |
| 2003/0118748 A1 | 6/2003 | Kumagai et al. | |
| 2003/0124873 A1 | 7/2003 | Xing et al. | |
| 2003/0143841 A1 | 7/2003 | Yang et al. | |
| 2003/0159656 A1 | 8/2003 | Tan et al. | |
| 2003/0172872 A1 | 9/2003 | Thakur et al. | |
| 2003/0199151 A1 | 10/2003 | Ho et al. | |
| 2003/0232495 A1 | 12/2003 | Moghadam et al. | |
| 2004/0008334 A1 | 1/2004 | Sreenivasan et al. | |
| 2004/0020601 A1 | 2/2004 | Zhao et al. | |
| 2004/0048492 A1 | 3/2004 | Ishikawa et al. | |
| 2004/0065253 A1 | 4/2004 | Pois et al. | |
| 2004/0079118 A1 | 4/2004 | M'Saad et al. | |
| 2004/0146661 A1 | 7/2004 | Kapoor et al. | |
| 2004/0152342 A1 | 8/2004 | Li et al. | |
| 2004/0161899 A1 | 8/2004 | Luo et al. | |
| 2004/0175501 A1 | 9/2004 | Lukas et al. | |
| 2004/0180557 A1 | 9/2004 | Park et al. | |
| 2004/0185641 A1 | 9/2004 | Tanabe et al. | |
| 2004/0219780 A1 | 11/2004 | Ohuchi | |
| 2004/0241342 A1 | 12/2004 | Karim et al. | |
| 2005/0001556 A1 | 1/2005 | Hoffman et al. | |
| 2005/0019494 A1 | 1/2005 | Moghadam et al. | |
| 2005/0026443 A1 | 2/2005 | Goo et al. | |
| 2005/0062165 A1 | 3/2005 | Saenger et al. | |
| 2005/0087140 A1 | 4/2005 | Yuda et al. | |
| 2005/0142895 A1 | 6/2005 | Ingle et al. | |
| 2005/0153574 A1 | 7/2005 | Mandal | |
| 2005/0181555 A1 | 8/2005 | Haukka et al. | |
| 2005/0186731 A1 | 8/2005 | Derderian et al. | |
| 2005/0186789 A1 | 8/2005 | Agarwal | |
| 2005/0196533 A1 | 9/2005 | Hasebe et al. | |
| 2005/0227499 A1 | 10/2005 | Park et al. | |
| 2005/0250340 A1 | 11/2005 | Chen et al. | |
| 2006/0011984 A1 | 1/2006 | Currie | |
| 2006/0014399 A1 | 1/2006 | Joe | |
| 2006/0030165 A1 | 2/2006 | Ingle et al. | |
| 2006/0055004 A1 | 3/2006 | Gates et al. | |
| 2006/0068599 A1 | 3/2006 | Baek et al. | |
| 2006/0075966 A1 | 4/2006 | Chen et al. | |
| 2006/0096540 A1 | 5/2006 | Choi | |
| 2006/0110943 A1 | 5/2006 | Swerts et al. | |
| 2006/0121394 A1 | 6/2006 | Chi | |
| 2006/0162661 A1 | 7/2006 | Jung et al. | |
| 2006/0178018 A1 | 8/2006 | Olsen | |
| 2006/0223315 A1 | 10/2006 | Yokota et al. | |
| 2006/0228903 A1 | 10/2006 | McSwiney et al. | |
| 2006/0281496 A1 | 12/2006 | Cedraeus | |
| 2006/0286776 A1 | 12/2006 | Ranish et al. | |
| 2007/0020392 A1 | 1/2007 | Kobrin et al. | |
| 2007/0026689 A1 | 2/2007 | Nakata et al. | |
| 2007/0049044 A1 | 3/2007 | Marsh | |
| 2007/0077777 A1 | 4/2007 | Gumpher | |
| 2007/0092661 A1 | 4/2007 | Ryuzaki et al. | |
| 2007/0128864 A1 | 6/2007 | Ma et al. | |
| 2007/0173073 A1 | 7/2007 | Weber | |
| 2007/0181966 A1 | 8/2007 | Watatani et al. | |

| | | | |
|---|---|---|---|
| 2007/0232071 | A1 | 10/2007 | Balseanu et al. |
| 2007/0232082 | A1 | 10/2007 | Balseanu et al. |
| 2007/0275569 | A1 | 11/2007 | Moghadam et al. |
| 2007/0281495 | A1 | 12/2007 | Mallick et al. |
| 2007/0281496 | A1 | 12/2007 | Ingle et al. |
| 2008/0000423 | A1 | 1/2008 | Fukiage |
| 2008/0085607 | A1 | 4/2008 | Yu et al. |
| 2008/0102223 | A1 | 5/2008 | Wagner et al. |
| 2008/0102650 | A1 | 5/2008 | Adams et al. |
| 2008/0188087 | A1 | 8/2008 | Chen et al. |
| 2008/0318429 | A1 | 12/2008 | Ozawa et al. |
| 2009/0061647 | A1 | 3/2009 | Mallick et al. |
| 2009/0104755 | A1 | 4/2009 | Mallick et al. |
| 2009/0104790 | A1 | 4/2009 | Liang |
| 2009/0325391 | A1* | 12/2009 | De Vusser et al. ............ 438/787 |
| 2010/0221925 | A1 | 9/2010 | Lee et al. |
| 2011/0014798 | A1 | 1/2011 | Mallick et al. |
| 2011/0034035 | A1 | 2/2011 | Liang et al. |
| 2011/0034039 | A1 | 2/2011 | Liang et al. |
| 2011/0045676 | A1 | 2/2011 | Park et al. |
| 2011/0111137 | A1 | 5/2011 | Liang et al. |

FOREIGN PATENT DOCUMENTS

| | | |
|---|---|---|
| EP | 0892083 A1 | 1/1999 |
| EP | 1717848 A | 11/2006 |
| JP | 01241826 A | 9/1989 |
| KR | 10-2004-0091978 A | 11/2004 |
| KR | 10-2005-0003758 A | 1/2005 |
| KR | 10-2005-0094183 A | 9/2005 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |

OTHER PUBLICATIONS

Gulleri, G. et al., "Deposition Temperature Determination of HDPCVD Silicon Dioxide Films," 2005, Microelectronic Engineering, vol. 82, pp. 236-241.

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, p. 14.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Lucovsky, G. et al., "Deposition of silicon dioxide and silicon nitride by remote plasma enhanced chemical vapor deposition," Journal of Vacuum Science & Technology, vol. 4, No. 3, May-Jun. (1986), pp. 681-688.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Aylett, B. J. et al., "Silicon-Nitrogen Compounds. Part V. Diphenylamino-derivatives of Silane," J. Chem. Soc. (A), 1969, pp. 636-638.

Aylett, B. J. et al., "Silicon-Nitrogen Compounds. Part VI.[1] The Preparation and Properties of Disilazane," J. Chem. Soc. (A), 1969, pp. 639-642.

Aylett, B. J. et al., "The Preparation and Some Properties of Disilylamine-Correspondence," Inorganic Chemistry, 1966, p. 167.

Beach, David B., "Infrared and Mass Spectroscopic Study of the Reaction of Silyl Iodide and Ammonia. Infrared Spectrum to Silylamine," Inorganic Chemistry, 1992, pp. 4174-4177, vol. 31 No. 20.

Burg, Anton B. et al., "Silyl-Amino Boron Compounds," J. Amer. Chem. Soc., Jul. 1950, pp. 3103-3107, vol. 72.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Norman, Arlan D. et al., "Reaction of Silylphosphine with Ammonia," Inoragnic Chemistry, 1979, pp. 1594-1597, vol. 18 No. 6.

Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.

Ward, L. G. L. et al., "The Preparation and Properties of *Bis*-Disilanyl Sulphide and *Tris*-Disilanylamine," J. Inorg. Nucl. Chem., 1961, pp. 287-293, vol. 21, Pergamon Press Ltd., Northern Ireland.

Ward, Laird G. L., "Bromosilane, Iodosilane, and Trisilylamine," Inorganic Syntheses, 1968, pp. 159-170, vol. 11.

\* cited by examiner

SILICON-OZONE CVD WITH REDUCED PATTERN LOADING USING INCUBATION PERIOD DEPOSITION

CROSS-REFERENCES TO RELATED APPLICATIONS

This application claims the benefit of U.S. Provisional Application No. 61/319,970 by Kweskin et al, filed Apr. 1, 2010 and titled "SILICON-OZONE CVD WITH REDUCED PATTERN LOADING USING INCUBATION PERIOD DEPOSITION" which is incorporated herein in its entirety for all purposes.

FIELD

This application relates to manufacturing technology solutions involving equipment, processes, and materials used in the deposition, patterning, and treatment of thin-films and coatings, with representative examples including (but not limited to) applications involving: semiconductor and dielectric materials and devices, silicon-based wafers and flat panel displays (such as TFTs).

BACKGROUND OF THE INVENTION

Forming dielectric layers on a substrate by chemical reaction of gases is one of the primary steps in the fabrication of modern semiconductor devices. These deposition processes include chemical vapor deposition (CVD) as well as plasma enhanced chemical vapor deposition (PECVD), which uses plasma in combination with traditional CVD techniques.

CVD and PECVD dielectric layers can be used as different layers in semiconductor devices. For example, the dielectric layers may be used as intermetal dielectric layers between conductive lines or interconnects in a device. Alternatively, the dielectric layers may be used as barrier layers, etch stops, or spacers, as well as other layers.

Dielectric layers that are used for applications such as barrier layers and spacers are typically deposited over features, e.g., horizontal interconnects for subsequently formed lines, vertical interconnects (vias), gate stacks, etc., in a patterned substrate. Preferably, the deposition provides a conformal layer. However, it is often difficult to achieve conformal deposition.

For example, it is difficult to deposit a barrier layer over a feature with few or no resulting surface defects or feature deformation. During deposition, the barrier layer material may overloaf, that is, deposit excess material on the shoulders of a via and deposit too little material in the base of the via, forming a shape that looks like the side of a loaf of bread. The phenomena is also known as footing because the base of the via has a profile that looks like a foot. In extreme cases, the shoulders of a via may merge to form a joined, sealed surface across the top of the via. The film thickness non-uniformity across the wafer can negatively impact the drive current improvement from one device to another. Modulating the process parameters alone does not significantly improve the step coverage and pattern loading problems.

Deposition of conformal layers over gate stacks to provide layers that are subsequently etched to form spacers is also challenging. While methods of depositing silicon nitride and silicon oxide layers for spacers using high temperature, low pressure conventional CVD have been developed, the thermal budget for such techniques is becoming too high as semiconductor device geometry continues to shrink. PECVD processes of silicon nitride and silicon oxide deposition can be performed at lower temperatures, but the step coverage and pattern loading results are not as desirable as those obtained with high temperature, low pressure CVD.

Therefore, a need exists for method of depositing conformal films over formed features in a patterned substrate.

BRIEF SUMMARY OF THE INVENTION

Aspects of the disclosure pertain to methods of depositing conformal silicon oxide layers on patterned substrates. In embodiments, dielectric layers are deposited by flowing a silicon-containing precursor and ozone into a processing chamber such that a relatively uniform dielectric growth rate is achieved across the patterned substrate surface having heterogeneous materials and/or a heterogeneous pattern density distribution. The deposition of dielectric layers grown according to embodiments may have a reduced dependence on underlying material and pattern density while still being suitable for non-sacrificial applications. Reduction in dependence on pattern density is achieved by terminating deposition near the end of an incubation period. Multiple deposition cycles may be conducted in series since the beneficial nature of the incubation period may repeat after a pause in deposition.

Embodiments of the invention include methods for forming a conformal silicon oxide layer on a patterned substrate in a substrate processing region in a processing chamber. The methods include a step of depositing a layer of silicon oxide during an incubation period. The step includes initiating flows of a silicon-containing precursor and ozone ($O_3$) into the substrate processing region, and terminating the flows of the silicon-containing precursor and ozone near the end of the incubation period to avoid the formation of a nonconformal layer of silicon oxide.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

DETAILED DESCRIPTION OF THE INVENTION

Aspects of the disclosure pertain to methods of depositing conformal silicon oxide layers on patterned substrates. In embodiments, dielectric layers are deposited by flowing a silicon-containing precursor and ozone into a processing chamber such that a relatively uniform dielectric growth rate is achieved across the patterned substrate surface having heterogeneous materials and/or a heterogeneous pattern density distribution. The deposition of dielectric layers grown according to embodiments may have a reduced dependence on underlying material and pattern density while still being suitable for non-sacrificial applications. Reduction in dependence on pattern density is achieved by terminating deposition near the end of an incubation period. Multiple deposition cycles may be conducted in series since the beneficial nature of the incubation period may repeat after a pause in deposition.

Embodiments of the invention are directed to methods of forming silicon oxide on a patterned surface of a substrate. Sub-atmospheric CVD (SACVD) and related processes involve flowing a silicon-containing precursor and an oxidizing precursor into a processing chamber to form silicon oxide on the substrate. The silicon-containing precursor may include TEOS and the oxidizing precursor may include ozone ($O_3$), oxygen ($O_2$) and/or oxygen radicals. The inventors have discovered that growing thin films within the incubation period of the process reduces the pattern-loading effect (PLE) of the deposited silicon oxide.

Without binding the claim coverage to hypothetical mechanisms, it is believed that a non-conformal film may initially be created early during the incubation period. Later in the incubation period, the thin portions of the film are thought to experience more rapid growth rates while the thicker portions of the film support less rapid growth rates. The effect is to even out the film thickness across the wafer and between different patterned structures. The inventors have also found that the growth rates during the incubation period are less selective, meaning the film growth rate is more similar from one material to another during the period. The non-selectivity helps to further improve conformality across the wafer and between different patterned structures.

Figure 1A:
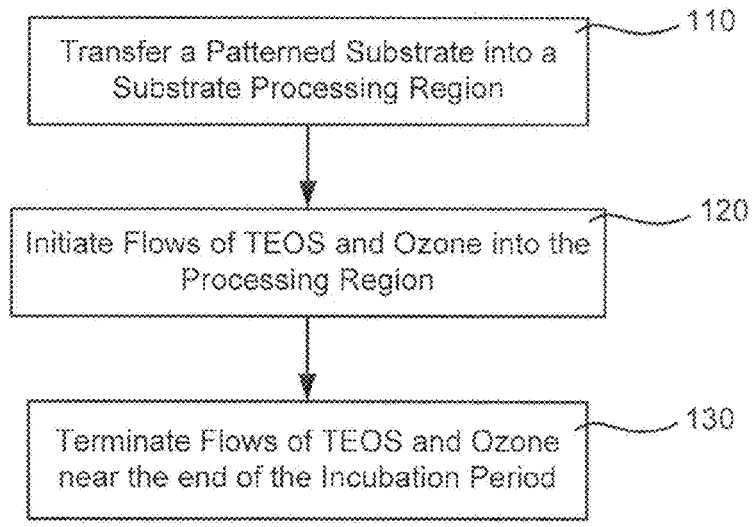
FIGS. 1A-1B are flow charts of a conformal silicon oxide deposition process according to disclosed embodiments.
Figure 1B:
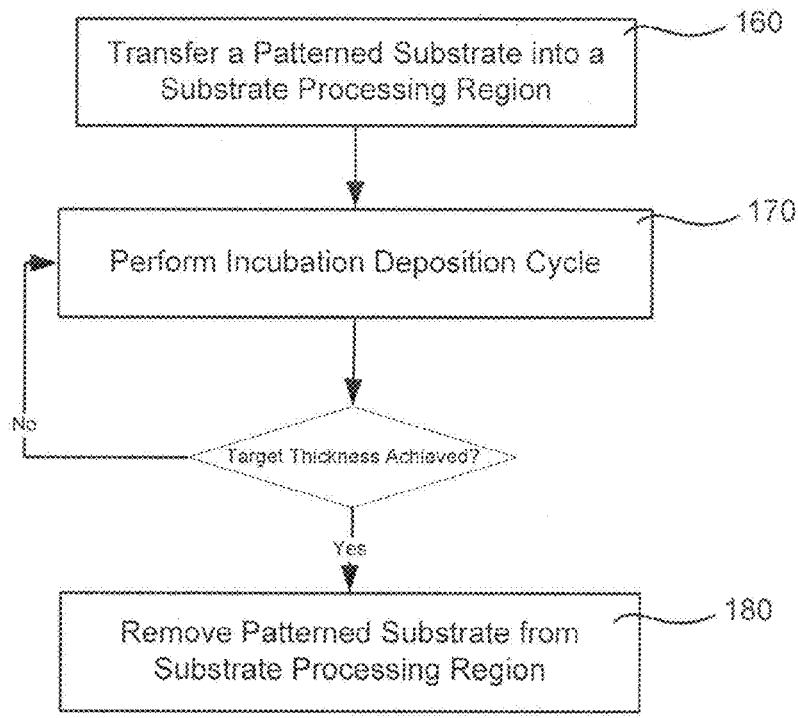
Figure 2A:
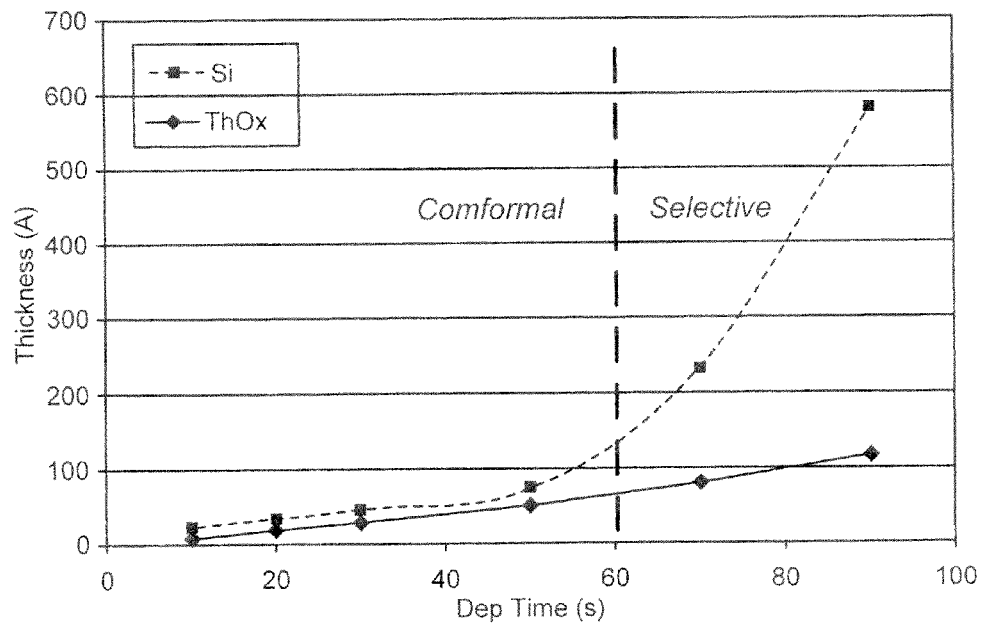
FIG. 2A is a graph of silicon oxide growth rates according to embodiments of the invention.
Figure 2B:
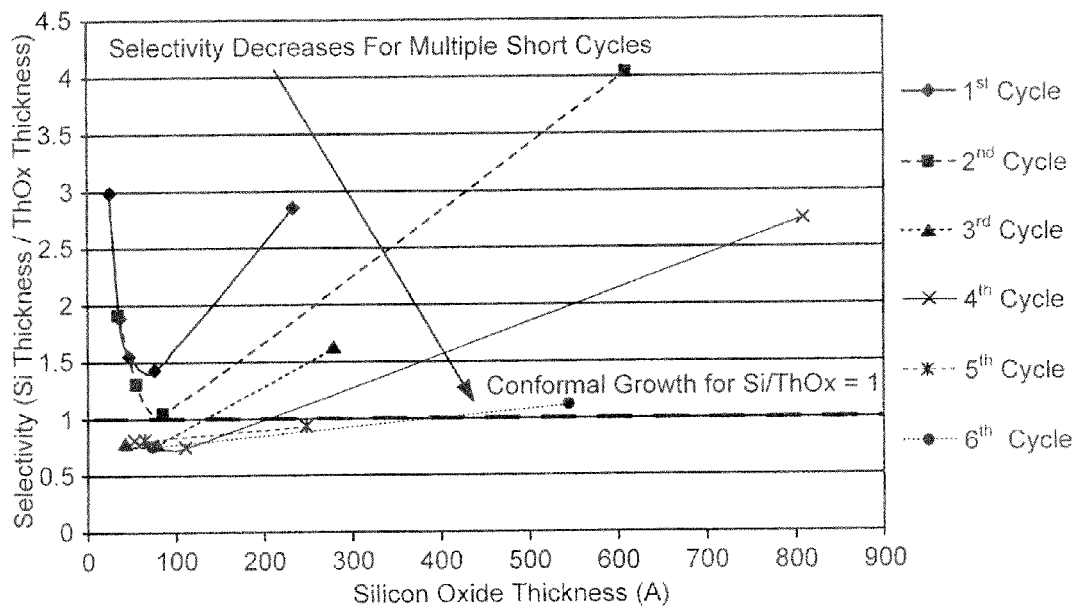
FIG. 2B is a graph of silicon oxide growth rate selectivity according to embodiments of the invention.

In order to better understand and appreciate the invention, reference is now made to FIGS. 1A-1B which are flow charts of a conformal silicon oxide deposition process according to disclosed embodiments. Properties of silicon oxide growth rates under various circumstances are shown in FIGS. 2A-2B to enhance the understanding of the silicon oxide deposition process. The process 100 in FIG. 1A begins when a patterned substrate is transferred into a substrate processing region (operation 110). TEOS and ozone flows are initiated into the region in operation 120 and a conformal layer of silicon oxide is formed between operation 120 and operation 130. The flows of both ozone and TEOS and ozone are terminated in operation 130. FIG. 2A shows how the growth rate remains comparable during the period of deposition represented in FIG. 1A. The silicon oxide deposition growth rate accelerates after the incubation period on exposed regions of silicon compared to exposed regions of silicon oxide. The vertical dashed line roughly indicates the point when the conformal deposition ends and the selective deposition begins in this exemplary embodiment.

Generally speaking, the flows of ozone and TEOS do not need to be initiated simultaneously nor do they have to be terminated simultaneously. The flow of TEOS is generally effected by flowing a carrier gas (e.g. $N_2$) through liquid TEOS such that the delivery rate of TEOS into the substrate processing region is above one of 1 g/min, 2 g/min or 3 g/min, in different embodiments. Both the carrier gas and the TEOS enter the substrate processing region. The flow of ozone is delivered along with more stable molecular oxygen. The flow rate of the ozone portion of that flow is above one of 1 slm, 2 slm, 3 slm, 5 slm or 10 slm, in different embodiments.

Typically, the initiation of the TEOS and ozone flows (operation 120) is followed by a period of slow growth and then a period of more rapid growth as represented in FIG. 2A. The process sequence shown in FIG. 1A interrupts (operation 130) the typical growth pattern near the transition from slow growth to rapid growth. If the typical growth pattern were interrupted earlier in the incubation period or too long after the transition to rapid growth, the conformality of the silicon oxide film would be reduced. An average deposition rate for each region may be defined by using the slope of a line drawn between the start and finish points on a plot of the deposited thickness vs. the time since initial deposition. In the case of the rapid growth, the line must be drawn between the transition start point and an extrapolated finish point to avoid under-reporting the deposition rate. The location of operation 130 along the time axis is somewhat flexible while still offering the benefits of conformality. The period of slow growth before operation 130 will be referred to as the incubation period herein. One may wish to adjust the location of operation 130 in order to tune a total deposition thickness. The deposition rate during the incubation period may exceed the deposition rate after the incubation period by a multiplicative factor of one of 1.3, 1.5, 1.7, 2.0, 2.5 or 3.0, in different embodiments. The deposition rate of silicon oxide between operation 120 and operation 130 may be greater than 50 Å, 70 Å, 80 Å, 90 Å, 100 Å or 110 Å, in different embodiments. The thickness of the conformal silicon oxide layer grown over one material (e.g. thermal silicon oxide) may be within one of 30%, 25%, 20%, 15%, 10% and 5% of the thickness of the conformal silicon oxide layer grown over another material (e.g. silicon), in embodiments of the invention.

Flow rates, as used herein, are not necessarily constant during the process. Flow rates of the different precursors may be initiated and terminated in different orders and their magnitudes may be varied. Unless otherwise indicated, mass flow rate magnitudes indicated herein are given for the approximate peak flow rate used during the process. Flow rate magnitudes indicated herein are for deposition on one side of a pair of 300 mm diameter wafers (area approximately 1400 $cm^2$). Appropriate correction based on deposition area is needed for a different number of wafers, larger or smaller wafers, double sided deposition or deposition on alternative geometry substrates (e.g. rectangular substrates).

The pressure in the substrate processing region are typical of many SACVD and HARP processes (e.g. 600 Torr). The pressure during the formation of the conformal silicon oxide film may be greater than one of 350 Torr, 400 Torr, 450 Torr, 500 Ton or 550 Torr, in different embodiments, to ensure desirable growth rates during the incubation period. Despite the name and acronym for the related process, sub-atmospheric chemical vapor deposition (SACVD), it should be noted that the processes described herein may be performed at pressures higher than atmospheric pressure (typically 760 Torr).

The substrate temperature is below a threshold value, in embodiments, also to stay within tight thermal budgets and to ensure that the deposition process possesses an incubation period. The temperature of the substrate during the deposition of the conformal silicon oxide is below one of 540° C., 500° C., 450° C., 400° C. and 350° C., in different embodiments. No plasma is present in the substrate processing region in embodiments. A small ac and/or dc voltage may be applied to the substrate processing region without detriment to the benefits of the deposition process, according to embodiments. Such an excitation should not be considered to deviate from the scope of "essentially" plasma-free or a process having "essentially" no plasma as may be recited in some claims.

FIG. 1B shows a repeated deposition of the process sequence described with reference to FIG. 1A. FIG. 2B shows the dependence of silicon oxide growth selectivity as a function of silicon oxide film thickness and incubation deposition cycle. The process 150 begins when a when a patterned substrate is transferred into a substrate processing region (operation 160). TEOS and ozone flows are initiated then terminated near the end of the incubation period as described previously. The initiation, film growth and termination of the flows occur within operation 170 in FIG. 1B. If the target thickness has been achieved, no additional cycles are performed and the patterned substrate may be removed from the substrate processing region (operation 180). However, if a larger film thickness is desired, the flows of TEOS and ozone may be started again which will result in another incubation period. The second incubation period may last for a shorter period of time than the first but will again segue into a period of more selective growth after an incubation period. The flows of TEOS and ozone are terminated near the transition from slow to rapid growth on exposed silicon surfaces. The process may even repeat more than two times if additional film thickness is required. FIG. 2B shows that the selectivity becomes even more conformal during subsequent cycles and stays more conformal for larger film thicknesses. This provides an additional benefit when conformal deposition is desired. Deposition sequences have been explored including six incubation cycles and resulted in conformal films nearly 600 Å thick. The flexibility provided by choosing a number for the multiple cycles in combination with adjusting the timing of the termination of one or both of the TEOS and ozone flows allows flexibility for achieving a desired silicon oxide film thickness. The thickness of the secondary layers described with reference to FIG. 1B may be greater than the same lower limits described with reference to the layer grown and described with reference to FIG. 1A.

The pattern loading was quantified by comparing the horizontal growth of the conformal silicon oxide layer from a vertical feature in a sparsely patterned region and a densely patterned region. An exemplary densely patterned region may have greater number of features than a sparsely patterned region to create the greater exposed surface area within a same area viewed from above the patterned substrate. A densely patterned region may have an exposed vertical area greater than a sparsely patterned region by a factor greater than one of 2, 3, 5, 10 or 20, in different embodiments. The thickness of the conformal silicon oxide layer in a densely patterned region may be within one of 30%, 25%, 20%, 15%, 10% and 5% of the thickness of the conformal silicon oxide layer in a sparsely patterned region, in different embodiments. The thickness in each region may be measured on vertical surfaces in which case the growth is in a horizontal direction. Alternatively, the thickness may be measured on a horizontal surface within each region and the growth may then be in the vertical direction. The terms "vertical" and "horizontal" are used throughout to include substantially vertical and substantially horizontal directions which may or may not deviate from the theoretical vertical and horizontal by up to about 10 degrees.

Exemplary Substrate Processing System

Deposition chambers that may implement embodiments of the present invention may include sub-atmospheric chemical vapor deposition (SACVD) chambers and more generally, deposition chambers which allow operation at relatively high pressures without necessarily applying plasma excitation. Specific examples of CVD systems that may implement embodiments of the invention include the CENTURA ULTIMA® SACVD chambers/systems, and PRODUCER® HARP, eHARP and SACVD chambers/systems, available from Applied Materials, Inc. of Santa Clara, Calif.

Figure 3:
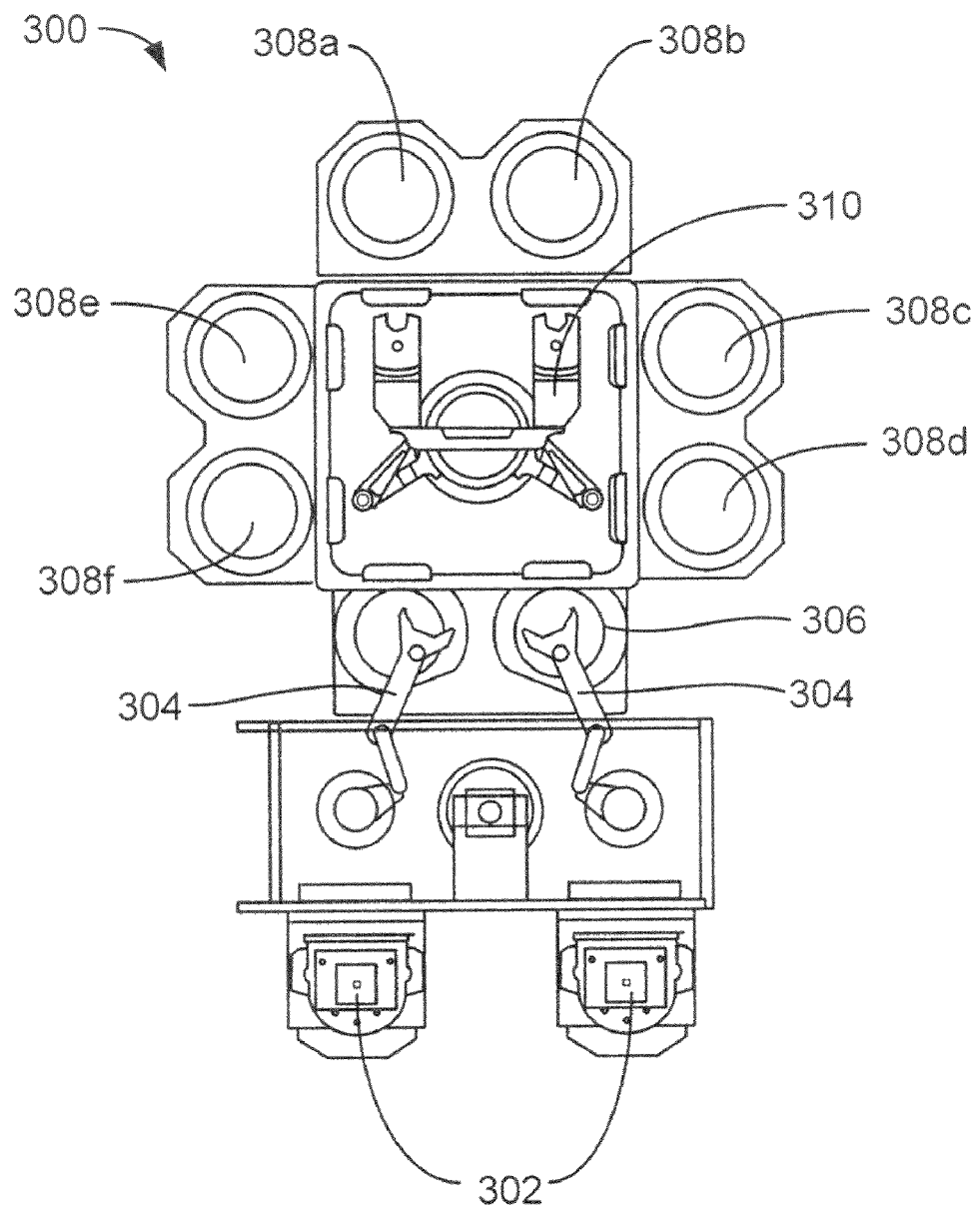
FIG. 3 shows a substrate processing system according to embodiments of the invention.

Embodiments of the deposition systems may be incorporated into larger fabrication systems for producing integrated circuit chips. FIG. 3 shows one such system 300 of deposition, baking and curing chambers according to disclosed embodiments. In the figure, a pair of FOUPs (front opening unified pods) 302 supply substrate substrates (e.g., 300 mm diameter wafers) that are received by robotic arms 304 and placed into a low pressure holding area 306 before being placed into one of the wafer processing chambers 308*a-f*. A second robotic arm 310 may be used to transport the substrate wafers from the holding area 306 to the processing chambers 308*a-f* and back.

The processing chambers 308*a-f* may include one or more system components for depositing, annealing, curing and/or etching a flowable dielectric film on the substrate wafer. In one configuration, two pairs of the processing chamber (e.g., 308*c-d* and 308*e*-D' may be used to deposit the flowable dielectric material on the substrate, and the third pair of processing chambers (e.g., 308*a-b*) may be used to anneal the deposited dielectic. In another configuration, the same two pairs of processing chambers (e.g., 308*c-d* and 308*e-f*) may be configured to both deposit and anneal a flowable dielectric film on the substrate, while the third pair of chambers (e.g., 308*a-b*) may be used for UV or E-beam curing of the deposited film. In still another configuration, all three pairs of chambers (e.g., 308*a-f*) may be configured to deposit and cure a flowable dielectric film on the substrate. In yet another configuration, two pairs of processing chambers (e.g., 308*c-d* and 308*e-f*) may be used for both deposition and UV or E-beam curing of the flowable dielectric, while a third pair of processing chambers (e.g. 308*a-b*) may be used for annealing the dielectric film. Any one or more of the processes described may be carried out on chamber(s) separated from the fabrication system shown in different embodiments.

Figure 4A:
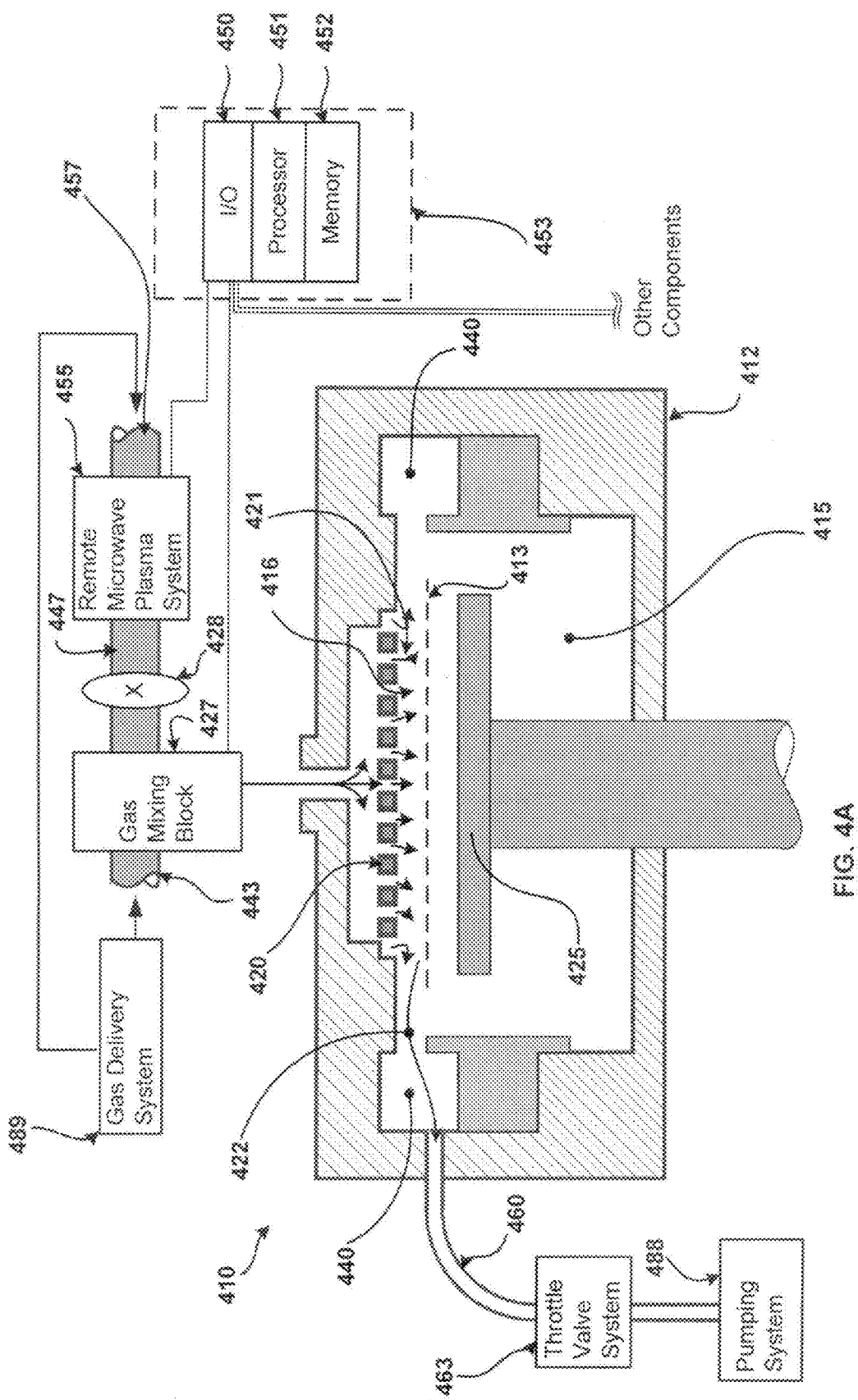
FIG. 4A shows is a cross-sectional view of a semiconductor processing chamber according to embodiments of the present invention.

FIG. 4A shows a simplified representation of an exemplary semiconductor processing chamber within a semiconductor processing tool 200. This exemplary chamber 410 is suitable for performing a variety of semiconductor processing steps which may include CVD processes, as well as other processes, such as reflow, drive-in, cleaning, etching, and gettering processes. Multiple-step processes can also be performed on a single substrate without removing the substrate from the chamber. Representative major components of the system include a chamber interior 415 that receives process and other gases from a gas delivery system 489, pumping system 488, a remote plasma system (RPS) 455, and a control system 453. These and other components are described below in order to understand the present invention.

The semiconductor processing chamber 410 includes an enclosure assembly 412 housing a chamber interior 415 with a gas reaction area 416. A gas distribution plate 420 is provided above the gas reaction area 416 for dispersing reactive gases and other gases, such as purge gases, through perforated holes in the gas distribution plate 420 to a substrate (not shown) that rests on a vertically movable heater 425 (which may also be referred to as a substrate support pedestal). The heater 425 can be controllably moved between a lower position, where a substrate can be loaded or unloaded, for example, and a processing position closely adjacent to the gas distribution plate 420, indicated by a dashed line 413, or to other positions for other purposes, such as for an etch or cleaning process. A center board (not shown) includes sensors for providing information on the position of the substrate.

Gas distribution plate 420 may be of the variety described in U.S. Pat. No. 6,793,733. These plates improve the uniformity of gas disbursement at the substrate and are particularly advantageous in deposition processes that vary gas concentration ratios. In some examples, the plates work in combination with the vertically movable heater 425 (or movable substrate support pedestal) such that deposition gases are released farther from the substrate when the ratio is heavily skewed in one direction (e.g., when the concentration of a silicon-containing gas is small compared to the concentration of an oxidizer-containing gas) and are released closer to the substrate as the concentration changes (e.g., when the concentration of silicon-containing gas in the mixture is higher). In other examples, the orifices of the gas distribution plate are designed to provide more uniform mixing of the gases.

The heater 425 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of the heater 425 exposed within the chamber interior 415 are made of a ceramic material, such as aluminum oxide ($Al_2O_3$ or alumina) or aluminum nitride.

Reactive and carrier gases are supplied through inlet tube 443 into a gas mixing box (also called a gas mixing block) 427, where they are preferably mixed together and delivered to the gas distribution plate 420. The gas mixing block 427 is preferably a dual input mixing block coupled to inlet tube 443 and to a cleaning/etch gas conduit 447. A valve 428 operates to admit or seal gas or plasma from conduit 447 to the gas mixing block 427. Conduit 447 receives gases from an RPS 455, which has an inlet 457 for receiving input gases. During deposition processing, gas supplied to the plate 420 is vented toward the substrate surface (as indicated by arrows 421), where it may be uniformly distributed radially across the substrate surface, typically in a laminar flow.

Purging gas may be delivered into the chamber interior 415 through the plate 420 and/or an inlet port or tube (not shown) through a wall (preferably the bottom) of enclosure assembly 412. The purging gas flows upward from the inlet port past the heater 425 and to an annular pumping channel 440 and may be useful to purge the chamber, for example, of ozone and TEOS between incubation period depositions. An exhaust system then exhausts the gas (as indicated by arrow 422) into the annular pumping channel 440 and through an exhaust line 460 to a pumping system 488, which includes one or more vacuum pumps. Exhaust gases and entrained particles are drawn from the annular pumping channel 440 through the exhaust line 460 at a rate controlled by a throttle valve system 463.

The RPS 455 can produce a plasma for selected applications, such as chamber cleaning or etching native oxide or residue from a process substrate. Plasma species produced in the remote plasma system 455 from precursors supplied via the input line 457 are sent via conduit 447 for dispersion through the plate 420 to the gas reaction area 416. Precursor gases for a cleaning application may include fluorine, chlorine, and other reactive elements. The RPS 455 also may be adapted to deposit plasma enhanced CVD films by selecting appropriate deposition precursor gases for use in the RPS 455.

The system controller 453 controls activities and operating parameters of the deposition system. The processor 451 executes system control software, such as a computer program stored in a memory 452 coupled to the processor 451. The memory 452 typically consists of a combination of static random access memories (cache), dynamic random access memories (DRAM) and hard disk drives but of course the memory 452 may also consist of other kinds of memory, such as solid-state memory devices. In addition to these memory means the semiconductor processing chamber 410 in a preferred embodiment includes a removable storage media drive, USB ports and a card rack (not shown).

The processor 451 operates according to system control software programmed to operate the device according to the methods disclosed herein. For example, sets of instructions may dictate the timing, mixture of gases, chamber pressure, chamber temperature, plasma power levels, susceptor position, and other parameters for carrying out one or more incubation period depositions in a sequence. The instructions are conveyed to the appropriate hardware preferably through direct cabling carrying analog or digital signals conveying signals originating from an input-output I/O module 450. Other computer programs such as those stored on other memory including, for example, a USB thumb drive, a floppy disk or another computer program product inserted in a disk drive or other appropriate drive, may also be used to operate the processor 451 to configure the semiconductor processing chamber 410 for varied uses.

The processor 451 may have a card rack (not shown) that contains a single-board computer, analog and digital input/output boards, interface boards and stepper motor controller boards. Various parts of the semiconductor processing system 200 conform to the Versa Modular European (VME) standard which defines board, card cage, and connector dimensions and types. The VME standard also defines the bus structure having a 16-bit data bus and 24-bit address bus.

A process for depositing a conformal silicon oxide layer on a patterned substrate or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

The embodiment disclosed herein relies on direct cabling and a single processor 451. Alternative embodiments comprising multi-core processors, multiple processors under distributed control and wireless communication between the system controller and controlled objects are also possible.

Figure 4B:
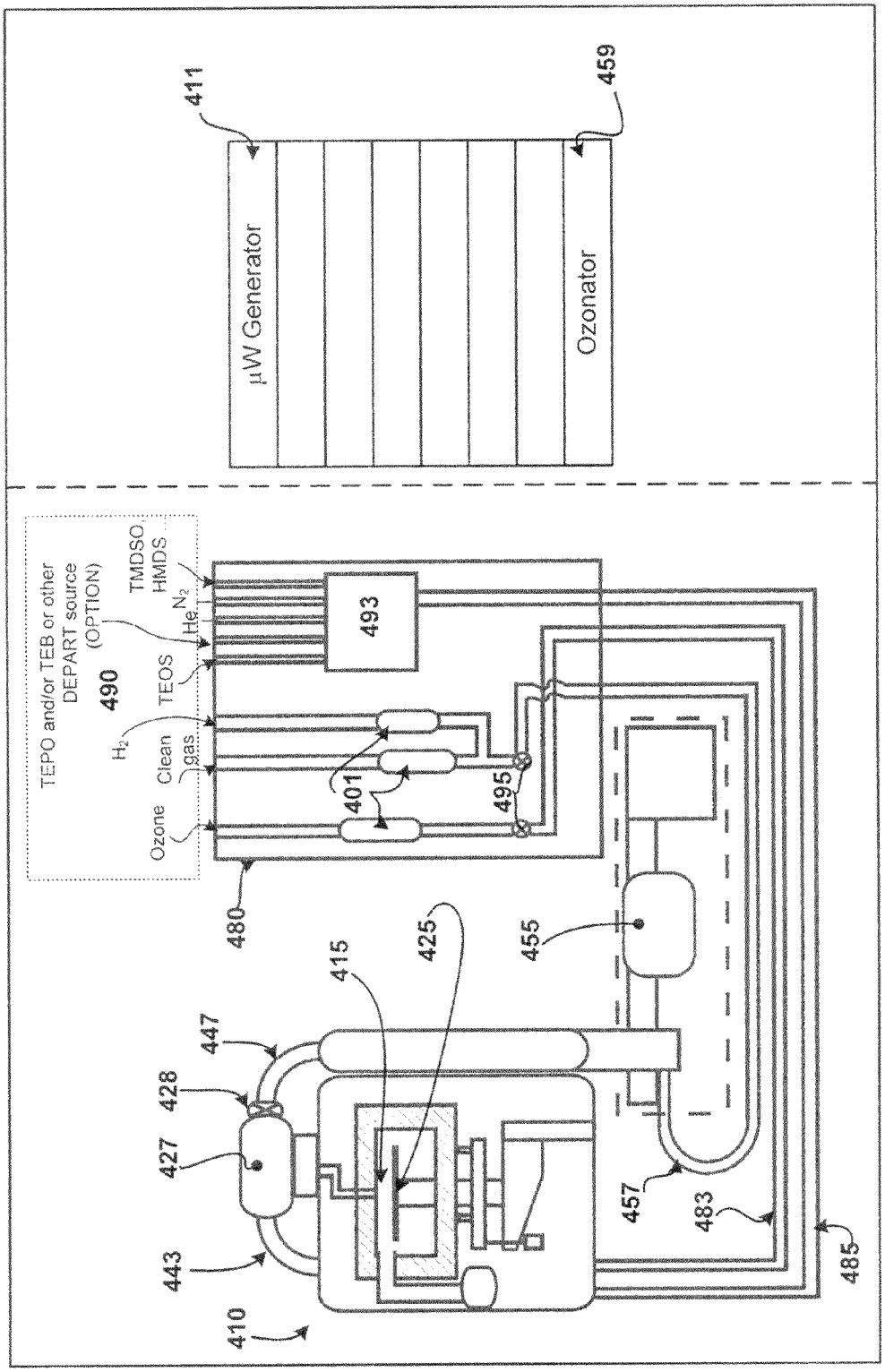
FIG. 4B shows a cross-sectional view of a gas panel and supply lines in relation to a processing chamber.

FIG. 4B shows a simplified representation of a gas supply panel 480 in relation to semiconductor processing chamber 410. As discussed above, the portion of semiconductor processing system 200 shown includes semiconductor processing chamber 410 with a heater 425, a gas mixing box 427 with inputs from inlet tube 443 and conduit 447, and RPS 455 with input line 457. As mentioned above, the gas mixing box 427 is configured for mixing and injecting deposition gas(es) and cleaning gas(es) or other gas(es) through inlet tube 443 and the input line 457 to the chamber interior 415.

The RPS 455 is integrally located and mounted below the processing chamber 410 with conduit 447 coming up alongside the chamber 410 to the gate valve 428 and the gas mixing box 427, located above the chamber 410. Plasma power generator 411 and ozonator 459 are located remote from the clean room. Delivery lines 483 and 485 from the gas supply panel 480 provide reactive gases to inlet tube 443. The gas supply panel 480 includes lines from gas or liquid sources 490 that provide the process gases for the selected application. The gas supply panel 480 has mixing system 493 that mixes selected gases before flow to the gas mixing box 427. In some embodiments, mixing system 493 includes a liquid injection system for vaporizing one or more reactant liquids such as tetraethylorthosilicate ("TEOS"), triethylborate ("TEB"), and triethylphosphate ("TEPO"). Vapor from the liquids is usually combined with a carrier gas, such as helium. Supply lines for the process gases may include (i) shut-off valves 495 that can be used to automatically or manually shut off the flow of process gas into line 485 or line 457, and (ii) liquid flow meters (LFM) 401 or other types of controllers that measure the flow of gas or liquid through the supply lines.

As an example, a mixture including TEOS as a silicon source may be used with mixing system 493 in a deposition process for forming a silicon oxide film during an incubation period. Sources of dopants such as phosphorous and boron may include TEPO and TEB which may also be introduced to mixing system 493. Precursors delivered to mixing system 493 may be liquid at room temperature and pressure and may be vaporized by conventional boiler-type or bubbler-type hot boxes. Alternatively, a liquid injection system may be used and offers greater control of the volume of reactant liquid introduced into the gas mixing system. The liquid is typically injected as a fine spray or mist into the carrier gas flow before being delivered to a heated gas delivery line 485 to the gas mixing block and chamber. Oxygen ($O_2$) and ozone ($O_3$) flow to the chamber through another gas delivery line 483, to be combined with the reactant gases from heated gas delivery line 485 near or in the chamber. Of course, it is recognized that other sources of dopants, silicon, oxygen and additive precursors may also be used. Though shown as an individual gas distribution line, line 485 may actually comprise multiple lines separated to discourage inter-precursor reactions before the precursors are flowed into chamber interior 415.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A layer of "silicon oxide" may include minority concentrations of other elemental constituents such as nitrogen, hydrogen, carbon and the like. A gas may be a combination of two or more gases. The terms trench and gap are used throughout with no implication that the etched geometry necessarily has a large horizontal aspect ratio. Viewed from above the surface, gaps may appear circular, oval, polygonal, rectangular, or a variety of other shapes. Gaps may also be a region between two pillars in which case the gaps are not physical separate from other gaps. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method for forming a conformal silicon oxide layer on a patterned substrate in a substrate processing region in a processing chamber, the method comprising:
a step of depositing a layer of silicon oxide during an incubation period comprising:
initiating flows of a silicon-containing precursor and ozone ($O_3$) into the substrate processing region, and
terminating the flows of the silicon-containing precursor and ozone near the end of the incubation period to avoid the formation of a nonconformal layer of silicon oxide.

2. The method of claim 1 wherein the patterned substrate has a densely patterned region and a sparsely patterned region and the flows of the silicon-containing precursor and the ozone are terminated such that a thickness of the conformal silicon oxide layer in the densely patterned region is within a conformality percentage of a thickness in the sparsely patterned region.

3. The method of claims 2 wherein the conformality percentage is 30%.

4. The method of claim 1 wherein the patterned substrate has a first exposed material and a second exposed material and the flows of the silicon-containing precursor and the ozone are terminated such that a thickness of the conformal silicon oxide layer deposited on the first exposed material is within a conformality percentage of a thickness deposited on the second exposed material.

5. The method of claims 4 wherein the conformality percentage is 30%.

6. The method of claim 1 wherein the layer of silicon oxide is not conformal at an earlier time during the incubation period but becomes conformal near the end of the incubation period.

7. The method of claim 1 further comprising an additional step of depositing an additional layer of silicon oxide during an additional incubation period.

8. The method of claim 1 wherein a deposition rate during the incubation period is similar on any two of silicon, silicon oxide and silicon nitride.

9. The method of claim 1 wherein a deposition rate on silicon after the incubation period is greater than during the incubation period by a multiplicative factor of 1.3.

10. The method of claim 1 wherein the step of depositing a layer of silicon oxide during an incubation period further comprises flowing water vapor.

11. The method of claim 7 wherein a duration of the additional incubation period is less than a duration of the incubation period.

12. The method of claim 1 wherein terminating the flows of the silicon-containing precursor and ozone near the end of the incubation period comprising terminating the flows of the silicon-containing precursor and ozone at a time selected to achieve a predetermined thickness for the conformal silicon oxide layer.

13. The method of claim 2 wherein an average exposed substantially-vertical area in the densely patterned region exceeds that of the sparsely patterned region by a multiplicative factor of 2.

14. The method of claim 2 wherein the two thicknesses of the conformal silicon oxide layer in the densely and sparsely patterned regions are measured on a substantially-vertical surface of the patterned substrate.

15. The method of claim 2 wherein the two thicknesses of the conformal silicon oxide layer in the densely and sparsely patterned regions are measured on a substantially-horizontal surface of the patterned substrate.

16. The method of claim 1 wherein essentially no plasma is applied to the substrate processing region.

17. The method of claim 1 further comprising the operation of flowing a carrier gas which carries the silicon-containing precursor into the substrate processing region.

18. The method of claim 1 wherein the silicon-containing precursor comprises TEOS.

19. The method of claim 1 further comprising:
a second step of depositing a second conformal layer of silicon oxide on the layer of silicon oxide, wherein the second step comprises:
initiating flows of a silicon-containing precursor and ozone ($O_3$) into the substrate processing region, and
terminating the flows of the silicon-containing precursor and ozone near the end of the incubation period to avoid the formation of a nonconformal layer of silicon oxide.

* * * * *